(12) United States Patent
Okami et al.

(10) Patent No.: US 9,764,943 B2
(45) Date of Patent: Sep. 19, 2017

(54) MEMS STRUCTURE

(71) Applicant: Murata Manufacturing Co., Ltd., Nagaokakyo-shi, Kyoto-fu (JP)

(72) Inventors: Tsuyoshi Okami, Hamamatsu (JP); Takashi Mizota, Hamamatsu (JP); Yuki Ueya, Hamamatsu (JP); Junya Matsuoka, Hamamatsu (JP); Nobuaki Tsuji, Hamamatsu (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/361,972

(22) Filed: Nov. 28, 2016

(65) Prior Publication Data
US 2017/0073216 A1 Mar. 16, 2017

Related U.S. Application Data

(63) Continuation of application No. PCT/JP2015/066146, filed on Jun. 4, 2015.

(30) Foreign Application Priority Data

Jun. 5, 2014 (JP) ................................. 2014-116650

(51) Int. Cl.
*B81B 3/00* (2006.01)
*G01C 19/5762* (2012.01)
(Continued)

(52) U.S. Cl.
CPC .............. *B81B 3/0021* (2013.01); *B81B 3/00* (2013.01); *G01C 19/5762* (2013.01);
(Continued)

(58) Field of Classification Search
CPC ... B81B 3/0021; H01L 41/125; H01L 41/113; H01L 41/1132
See application file for complete search history.

(56) References Cited

U.S. PATENT DOCUMENTS 6,082,197 A 7/2000 Mizuno et al.
6,407,481 B1 6/2002 Takeuchi et al.
(Continued)

FOREIGN PATENT DOCUMENTS

EP 1354848 A2 * 10/2003 ........... B81B 3/0021
JP H08304450 A 5/1995
(Continued)

OTHER PUBLICATIONS

International Search Report issued for PCT/JP2015/066146, date of mailing Jul. 7, 2015.
(Continued)

*Primary Examiner* — Ermias Woldegeorgis
(74) *Attorney, Agent, or Firm* — Arent Fox LLP (57) ABSTRACT

A MEMS structure includes a planar substrate, a support body coupled to the planar substrate, a fixed electrode coupled to the planar substrate and a moveable portion. The movable portion is spaced from and faces the fixed electrode. The movable electrode includes a movable weight and an intermediate frame surrounding an outer edge of the movable weight. A plurality of elastic supports connect the movable weight to the intermediate frame. The elastic supports are elastically deformable in a first direction extending parallel to the plane of the substrate such that the movable weight can move in the first direction. At least one torsion bar pivotally connects one end of the intermediate frame to the support body so as to allow the intermediate frame, and with it the movable weight, to pivot around an axis which extends parallel to the plane of the substrate and perpendicular to the first direction.

8 Claims, 2 Drawing Sheets

(51) Int. Cl.
*H01L 41/113* (2006.01)
*H01L 41/12* (2006.01)

(52) U.S. Cl.
CPC ..... *B81B 2201/0228* (2013.01); *H01L 41/113* (2013.01); *H01L 41/1132* (2013.01); *H01L 41/125* (2013.01)

(56) References Cited

U.S. PATENT DOCUMENTS

| | | | |
|---|---|---|---|
| 8,922,861 | B2 | 12/2014 | Koyama |
| 2004/0081391 | A1* | 4/2004 | Ko ........................ B81B 3/0062 385/18 |
| 2009/0139328 | A1* | 6/2009 | Inoue ................. G01C 19/5719 73/514.02 |
| 2010/0301699 | A1* | 12/2010 | Zhang ...................... H02N 1/08 310/300 |
| 2011/0219875 | A1 | 9/2011 | Walther et al. |
| 2014/0331770 | A1 | 11/2014 | Jourdan et al. |

FOREIGN PATENT DOCUMENTS

| | | | |
|---|---|---|---|
| JP | 2000317898 | A | 11/2000 |
| JP | 2008058259 | A | 3/2008 |
| JP | 2011191304 | A | 9/2011 |
| JP | 2012203186 | A | 10/2012 |

OTHER PUBLICATIONS

Written Opinion of the International Searching Authority issued for PCT/JP2015/066146, date of mailing Jul. 7, 2015.

* cited by examiner

MEMS STRUCTURE

CROSS REFERENCE TO RELATED APPLICATIONS

The present application is a continuation of International application No. PCT/JP2015/066146, filed Jun. 4, 2015, which claims priority to Japanese Patent Application No. 2014-116650, filed Jun. 5, 2014, the entire contents of each of which are incorporated herein by reference.

TECHNICAL FIELD

The present invention relates to a MEMS (Micro Electro Mechanical Systems) structure constructed using a MEMS technique.

BACKGROUND ART

In recent years, MEMS structures produced using a MEMS technique have been used for various sensors (for example, an acceleration sensor, a gyro sensor, and the like) for detecting physical quantities. Each of the MEMS structures used for such sensors has a movable portion that can be displaced according to an external cause, and is configured to detect a physical quantity by converting deformation and displacement of the movable portion into an electrical signal and outputting the electrical signal.

As an invention regarding such a MEMS structure, the invention described in Japanese Patent Laying-Open No. 2008-058259 (Patent Document 1) has been known, for example. Patent Document 1 describes an inertia sensor capable of detecting, by way of driving oscillation in a direction of first axis of three axes orthogonal to one another, an angular velocity in a direction of second axis. In the inertia sensor described in Patent Document 1, an oscillator, which serves as the movable portion, is supported by an elastic supporting portion to be displaceable in a predetermined driving direction (for example, X-axis direction) and a detection direction (for example, Y-axis direction/Z-axis direction) orthogonal to the driving direction. The inertia sensor is configured such that displacement of the movable portion in the detection direction can be detected by a detection electrode as a change of capacitance. Therefore, in Patent Document 1, the elastic supporting portion for supporting the movable portion is configured to be elastically deformable, and has degrees of freedom in the driving direction and the two detection directions.

SUMMARY OF INVENTION

Technical Problem

As described above, in the inertia sensor described in Patent Document 1, the movable portion is supported by the elastic supporting portion. Since sensitivity of the sensor is affected by a spring constant in the elastic supporting portion and a resonant frequency depending on the spring constant, the spring constant and resonant frequency of the elastic supporting portion need to be adjusted/selected.

Regarding this point, if the elastic supporting portion is employed to support the movable portion such that the movable portion is displaceable in the two detection directions orthogonal to each other as in the configuration described in Patent Document 1, adjustment of the spring constant and resonant frequency in one detection direction (for example, Y-axis direction) to desired values affects the spring constant and resonant frequency in the other detection direction (for example, Z-axis direction). Therefore, in such a configuration, it is very difficult to adjust, to respective desired values, the resonant frequencies in the two detection directions. This makes it difficult to adjust the sensitivity of the sensor to a desired value.

The present invention has been made in view of the problem described above, relates to a MEMS structure that is produced using the MEMS technique and that has a movable portion displaceable in two direction, and provides a MEMS structure capable of readily adjusting, to desired values, resonant frequencies in two directions.

A MEMS structure according to aspect first preferred embodiment of the present invention includes a planar substrate, a support body coupled to the planar substrate, a fixed electrode coupled to the planar substrate, and a movable portion spaced from and facing the fixed electrode. The movable portion is coupled to the substrate and includes a movable weight and an intermediate frame surrounding an outer edge of the movable weight. A plurality of elastic supports connect the movable weight to intermediate frame. The elastic supports are elastically deformable in a first direction extending parallel to the plane of the planar substrate such that the movable weight can move in the first direction. At least one torsion bar pivotally connects one end of the intermediate frame to the support body so as to allow the intermediate frame, and with it the movable weight, to pivot around an axis which extends parallel to the plane of the planar substrate and perpendicular to the first direction. As a result of this structure, the movable portion can be displaced in the two directions.

With this structure adjustment/selection of the elastic supporting portion for a resonant frequency or the like does not affect a resonant frequency or the like of the torsion bar, and adjustment/selection of the torsion bar for the resonant frequency or the like does not affect the resonant frequency or the like of the elastic supporting portion. That is, resonant frequencies or the like in the two perpendicular directions can be adjusted without affecting each other, thus readily adjusting them to desired values. Accordingly, the sensitivity of the sensor can also be readily adjusted to a desired value.

In a further aspect of the invention, the movable weight has a rectangular shape including first and second opposite edges extending along the first direction and third and fourth opposite edges extending along the second direction. At least one of the elastic supports is connected between the first edge and the intermediate frame and at least one of the elastic supports is connected between the second edge and the intermediate frame.

According to yet another aspect of the present the movable weight has four corners and the elastic supports connect the four corners of the movable weight to the intermediate frame. In yet a further aspect of the invention, the support body and the movable portion are planar in shape and lie in the same plane.

In accordance with a second preferred embodiment of the invention, the MEMS structure includes a planar substrate, a support body coupled to the planar substrate, a fixed electrode coupled to the planar substrate, and a movable portion spaced from and facing the fixed electrode. The movable portion is coupled to the planar substrate and includes a movable weight and an intermediate frame surrounding an outer edge of the movable weight. At least one torsion bar pivotally connects one end of the movable weight to the intermediate frame so as to allow the movable weight to pivot around an axis which extends parallel to the plane of the planar substrate and in a first direction. A plurality of elastic supports connect the intermediate frame to the support body. The elastic supports are elastically deformable in a second direction extending horizontal to the plane of the planar substrate and perpendicular to the first direction such that the intermediate frame, and with it the movable weight, can move in the second direction. As a result of this structure, the movable portion can be displaced in the two directions.

With this structure adjustment/selection of the elastic supporting portion for a resonant frequency or the like does not affect a resonant frequency or the like of the torsion bar, and adjustment/selection of the torsion bar for the resonant frequency or the like does not affect the resonant frequency or the like of the elastic supporting portion. That is, resonant frequencies or the like in the two perpendicular directions can be adjusted without affecting each other, thus readily adjusting them to desired values. Accordingly, the sensitivity of the sensor can also be readily adjusted to a desired value.

In accordance with a further aspect of the invention, the movable weight has a rectangular shape including first and second opposite edges extending along the first direction and third and fourth opposite edges extending along the second direction and the at least one torsion bar is connected between the first edge and the intermediate frame. In yet a further aspect of the invention, the intermediate frame has four corners and the elastic supports connect the four corners of the intermediate frame to the support body. In yet a further aspect of the invention, the support body and the movable portion are planar in shape and lie in the same plane.

In the MEMS structure according to the preferred embodiments of the present invention, the movable portion includes the weight portion, the frame-shaped portion, the elastic supporting portion, and the torsion bar to achieve (i) displacement of the movable portion by the elastic supporting portion in the first direction and (ii) displacement of the movable portion by the torsion bar due to shaking of the movable portion. Moreover, since the frame-shaped portion is positioned between the elastic supporting portion and the torsion bar, resonant frequencies or the like in the different two directions can be adjusted/selected without affecting each other, thereby readily adjusting them to desired values.

DESCRIPTION OF EMBODIMENTS

With reference to figures, the following describes two embodiments of a MEMS structure according to the present invention is applied to a MEMS structure 1 constituting a portion of a capacitive type angular velocity sensor. It should be noted that for ease of description, some portions in the figures for the description below are illustrated in sizes and scales different from their actual sizes and scales.

First Embodiment

Figure 1:
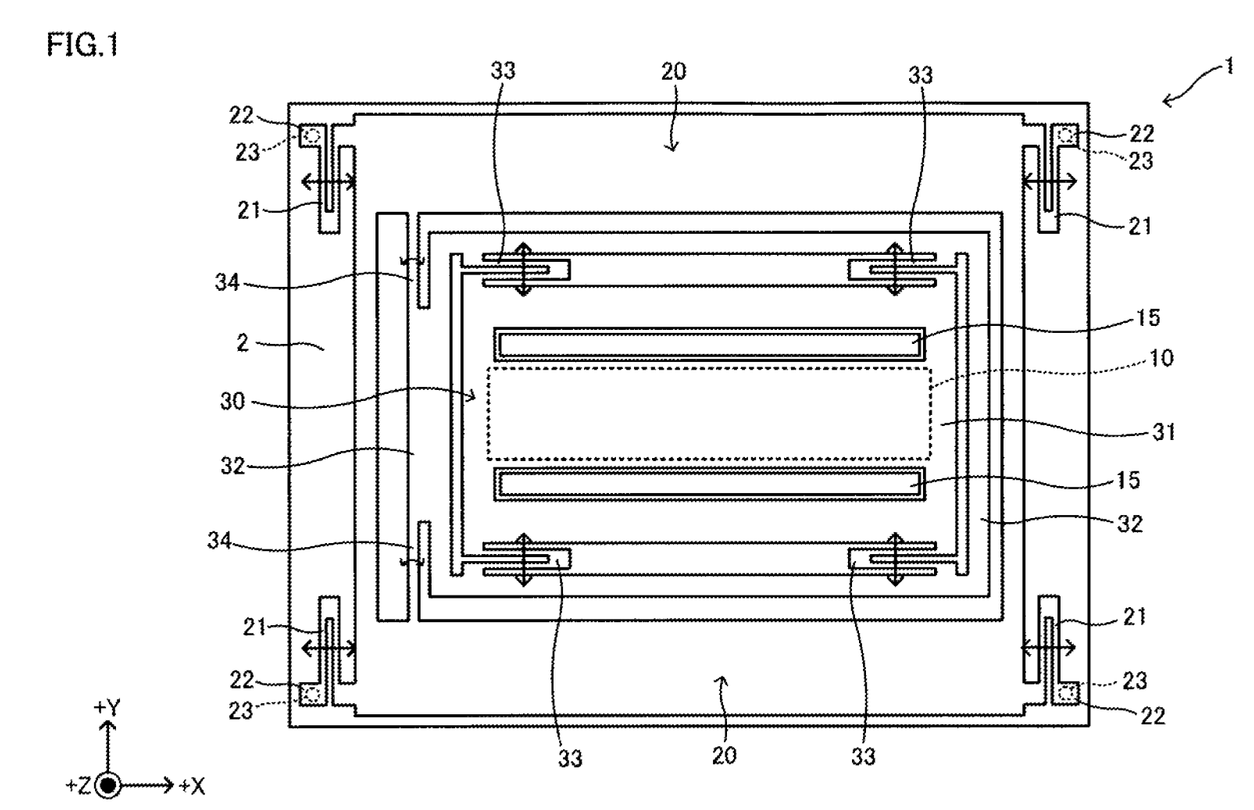
FIG. 1 is a plan view showing a schematic configuration of a MEMS structure according to a first embodiment.

First, the following describes a schematic configuration of a MEMS structure 1 according to a first embodiment in detail with reference to FIG. 1. As described above, MEMS structure 1 according to the present embodiment is produced using a known MEMS (Micro Electro Mechanical Systems) technique, and constitutes a capacitive type angular velocity sensor.

(Configuration of MEMS Structure)

As shown in FIG. 1, MEMS structure 1 is configured such that a main body portion 20 and a movable portion 30 are positioned by anchors 22 or the like above a Z-direction detection electrode 10. Anchors 22 are formed on a substrate 2, and Z-direction detection electrode 10 is fixedly provided on a surface of substrate 2. Substrate 2 is preferably in the form of a chip or plate having a substantially rectangular shape.

In the description below, as indicated by arrows in FIG. 1, the X direction is a direction along the long side direction of substrate 2, the Y direction is a direction perpendicular to the X direction and extending along the short side direction of substrate 2, and the Z direction is a direction perpendicular to both the X direction and the Y direction.

Substrate 2 preferably has an insulating layer formed to cover the upper surface of a core substrate that is in the form of a plate, and the Z direction detection electrode 10 and a the Y direction detection electrode 15 are formed on a surface of the insulating layer of substrate 2. Z direction detection electrode 10 is fixedly provided along the surface of substrate 2, and Y direction detection electrode 15 is provided to project perpendicularly to the surface of substrate 2 and is fixed on substrate 2. On the upper surface of substrate 2, the main body portion 20, the movable portion 30, and the like are preferably formed by etching a low-resistance silicon material or the like having conductivity, for example.

As shown in FIG. 1, main body portion 20 and plate-like movable portion 30 are positioned at the center portion of substrate 2. Main body portion 20 and movable portion 30 are positioned in parallel with each other (and preferably in the same plane) and are spaced from the surface of substrate 2 by a predetermined distance by anchors 22 provided at four corners of substrate 2. Main body portion 20 includes a movable electrode (not shown) for oscillation, and is formed to attain oscillation in the X direction by cooperating with a fixed electrode for oscillation (not shown) provided on the surface of substrate 2.

Anchors 22 are provided at the four corners of substrate 2 to project in the form of cuboids. Driving springs 21 are formed at the corner portions of main body portion 20 to connect the main body portion 30 to anchors 22. Each of driving springs 21 has one end connected to a corner portion of main body portion 20 and has the other end connected to an anchor 22, and is configured to expand and contract (and therefore allow movement of the moveable portion 30) in the X direction. Thus, main body portion 20 is supported by driving springs 21 on anchors 22 fixed on the four corners of substrate 2, whereby main body portion 20 is maintained above substrate 2 with a space therebetween. Moreover, each of anchors 22 is provided with a through hole 23 filled with a conductive material. Through hole 23 preferably is electrically connected to an electrode layer formed in substrate 2.

Movable portion 30 is formed at the center portion of main body portion 20 and includes a movable weight 31, an intermediate frame portion 32, elastic supporting portions 33, and a torsion bar 34, and is provided to be displaceable relative to main body portion 20 . It should be noted that movable portion 30 is preferably formed to be located in the substantially same plane as main body portion 20 in a normal state (i.e., when no external force acts thereon), and the upper surface of movable portion 30 is located at a location above the upper surface of main body portion 20 in the Z direction.

Movable weight 31 is a preferably a plate having a substantially rectangular shape when viewed in a plan view and is positioned such that long sides of movable weight 31 extend along the X direction. Movable weight 31 is coupled to an inner portions of intermediate frame portion 32 by elastic supporting portions 33 and faces the Z direction detection electrode 10 located on the surface of substrate 2. As described below, movable weight 31 and intermediate frame portion 32 are disposed to be displaceable in the Z direction relative to main body portion 20 with the result that a capacitance between movable portion 30 and Z direction detection electrode 10 can change in as a result of a change in the distance between the movable weight 31 and the Z direction detection electrode 10 as measured in the Z direction in response to external forces. Further, movable weight 31 is provided to be displaceable in the Y direction relative to main body portion 20, and can also change a capacitance between movable portion 30 and Y direction detection electrode 15 by changing its distance from Y direction detection electrode 15.

Intermediate frame portion 32 is preferably formed in the form of a rectangular frame when viewed in a plan view and is positioned to surround the outer edges of movable weight 31 with a space between the inner wall of intermediate frame portion 32 and the outer edge of movable weight 31. Elastic supporting portions 33 connect movable weight 31 to intermediate frame portion 32 preferably at the four corners of the moveable weight 31. A pair of torsion bars 34 formed on the left side of the movable portion 30 as viewed in FIG. 1 connect intermediate frame portion 32 to main body portion 20. Therefore, intermediate frame portion 32 is supported to be pivotable about the axis of the torsion bars 34 relative to main body portion 20. As a result, the right hand side of intermediate frame portion 32 (as viewed in FIG. 1) can be displaced in the Z direction.

In the long side direction (i.e., in the X direction) of intermediate frame portion 32, one end portion of each elastic supporting portion 33 is connected to a respective corner portion of movable weight 31, and the other end portion of elastic supporting portion 33 is connected to a respective inner side surface in intermediate frame portion 32. As a result, each elastic supporting portion 33 supports movable weight 31 at a respective end portion extending in the X direction, thereby supporting the four corner portions of movable weight 31. Each elastic supporting portion 33 is configured to expand and contract in the Y direction, and holds movable weight 31 such that movable weight 31 can be displaced relative to intermediate frame portion 32 in the Y direction. Moreover, elastic supporting portion 33 is formed to exhibit a predetermined rigidity in the X and Z directions. Therefore, movable weight 31 is prevented by elastic supporting portions 33 from being displaced (in any significant amount) in the X and Z directions relative to intermediate frame portion 32, and operates together with intermediate frame portion 32 when movable portion 30 is displaced in the Z direction.

Each torsion bar 34 is formed at the left hand side of intermediate frame portion 32 and preferably takes the form of a bar extending in the Y direction with one end connected to main body portion 20 and has the other end connected to the end portion of intermediate frame portion 32 in the X direction. Therefore, torsion bar 34 supports the left hand side of movable portion 30 such that the movable weight 31 can be pivoted relative to main body portion 20 along the axis of the torsion bar extending in the Y direction and can be twisted and deformed according to external forces applied to movable portion 30.

Accordingly, movable portion 30 (including movable weight 31 and intermediate frame portion 32) is supported to be pivotable relative to main body portion 20 about the axis of torsion bars 34, whereby the right end side of movable portion 30 can be displaced in the Z direction. Accordingly, the capacitance between movable portion 30 and Z direction detection electrode 10 can be changed, whereby a change in angular velocity can be detected in accordance with the change in capacitance. Moreover, since each torsion bar 34 is formed at the left end portion of movable portion 30 in the X direction, a large torque resulting from external forces applied to the movable portion 30 can be obtained. In accordance with MEMS structure 1, this can contribute to improvement in sensitivity of the sensor.

(Displacement of Movable Weight 31 in Y Direction)

The following describes an operation of each portion in MEMS structure 1 according to the first embodiment configured as described above when movable portion 30 is displaced in the Y direction. When an external force acts on MEMS structure 1 to displace movable weight 31 in the Y direction, in the range of intermediate frame portion 32, movable weight 31 elastically deforms and displaces each elastic supporting portion 33 in the Y direction. When this happens, intermediate frame portion 32 is supported on main body portion 20 by torsion bars 34 and is therefore held without being displaced in the Y direction. In other words, in accordance with MEMS structure 1 according to the first embodiment, movable weight 31 constituting a large part (preferably over 50%) of movable portion 30 is displaced in the Y direction by an external force while deforming each elastic supporting portion 33, so that the displacement of movable weight 31 in the Y direction can be detected in accordance with a change in capacitance between movable weight 31 and Y direction detection electrode 15.

Thus, in MEMS structure 1 according to the first embodiment, each elastic supporting portion 33 connecting movable weight 31 to intermediate frame portion 32, rather than torsion bar 34 connecting main body portion 20 to intermediate frame portion 32, allows movable weight 31 to move in the Y direction. Hence, in accordance with MEMS structure 1 according to the first embodiment, in order to adjust the resonant frequency in relation with the Y direction, the spring constant of each elastic supporting portion 33 involved in the displacement of movable portion 30 in the Y direction can be adjusted/selected, thereby adjusting the resonant frequency in relation with the Y direction to a desired value.

Furthermore, in the first embodiment, each elastic supporting portion 33 connects movable weight 31 to intermediate frame portion 32, and torsion bar 34 connects intermediate frame portion 32 to main body portion 20 . Therefore, the spring constant of torsion bar 34 is not affected by adjusting the spring constant of each elastic supporting portion 33. Therefore, in accordance with MEMS structure 1, the spring constant of torsion bar 34 does not need to be taken into consideration when adjusting the resonant frequency in relation with the Y direction, whereby the resonant frequency in relation with the Y direction can be readily adjusted to a desired value.

(Displacement of Movable Portion 30 in Z Direction)

Next, the following describes an operation of each portion in MEMS structure 1 according to the first embodiment when movable portion 30 is displaced in the Z direction. When an external force acts on MEMS structure 1 to displace movable portion 30 in the Z direction, movable weight 31 is supported by each elastic supporting portion 33 within the range of intermediate frame portion 32 and is regulated from being displaced relative to intermediate frame portion 32 in the Z direction. Accordingly, movable weight 31 is displaced in the Z direction together with intermediate frame portion 32. On the other hand, intermediate frame portion 32, which is supported to be pivotable relative to main body portion 20 by torsion bar 34 formed at the left end portion thereof, is configured to be displaceable in the Z direction in response to external forces applied to the movable portion 30 in the Z direction. Thus, in accordance with MEMS structure 1 according to the first embodiment, movable portion 30 (including movable weight 31 and intermediate frame portion 32) is displaced in the Z direction by an external force while twisting, deforming, and shaking intermediate frame portion 32, so that the displacement of movable portion 30 in the Z direction can be detected in accordance with an amount of change in capacitance between movable portion 30 and Z direction detection electrode 10.

Thus, in MEMS structure 1 according to the first embodiment, torsion bar 34 connecting main body portion 20 to intermediate frame portion 32, rather than each elastic supporting portion 33 connecting movable weight 31 to intermediate frame portion 32, acts to displace movable portion 30 in the Z direction. Hence, in accordance with MEMS structure 1, in order to adjust the resonant frequency in relation with the Z direction, the spring constant of torsion bar 34 involved in the displacement of movable portion 30 in the Z direction can be adjusted/chosen, thereby adjusting the resonant frequency in relation with the Z direction to a desired value.

As described above, each elastic supporting portion 33 connects movable weight 31 to intermediate frame portion 32, and torsion bar 34 connects main body portion 20 to intermediate frame portion 32. Therefore, the spring constant of each elastic supporting portion 33 is not affected by adjusting the spring constant of torsion bar 34. Therefore, in accordance with MEMS structure 1, the spring constant of each elastic supporting portion 33 does not need to be taken into consideration when adjusting the resonant frequency in relation with the Z direction, whereby the resonant frequency in relation with the Z direction can be readily adjusted to a desired value.

As described above, in MEMS structure 1 according to the first embodiment, movable weight 31 is connected to intermediate frame portion 32 by elastic supporting portions 33 which are elastically deformable in the Y direction, so that movable portion 30 is configured to be displaceable in the Y direction. Moreover, since intermediate frame portion 32 is supported to be pivotable along the Y axis relative to main body portion 20 by torsion bars 34 provided at the one end portion in the X direction, movable portion 30 is configured to be displaceable in the Z direction. Thus, in accordance with MEMS structure 1, movable weight 31 can be displaced in the two directions, i.e., the Y and Z directions.

Moreover, in accordance with MEMS structure 1, since intermediate frame portion 32 is positioned between each elastic supporting portion 33 and each torsion bar 34, the adjustment/selection of each elastic supporting portion 33 for the resonant frequency or the like does not affect the resonant frequency or the like of torsion bar 34, and the adjustment of torsion bar 34 for the resonant frequency or the like does not affect the resonant frequency or the like of each elastic supporting portion 33. That is, in accordance with MEMS structure 1, the resonant frequencies or the like in relation with the Y and Z directions can be adjusted/selected without affecting each other, thus readily adjusting them to desired values. Accordingly, the sensitivity of the sensor can also be readily adjusted to a desired value.

In MEMS structure 1, each elastic supporting portion 33 connects movable weight 31 to intermediate frame portion 32 at a respective corner portion of movable weight 31 (which preferably takes the form of a rectangular plate) and prevents any significant displacement of movable weight 31 relative to intermediate frame portion 32 in the X and Z directions. Thus, in accordance with MEMS structure 1, each elastic supporting portion 33 permits displacement of movable weight 31 relative to intermediate frame portion 32 in the Y direction, and more securely suppresses the displacement of movable weight 31 relative to intermediate frame portion 32 in the X direction and the Z direction.

Second Embodiment

Figure 2:
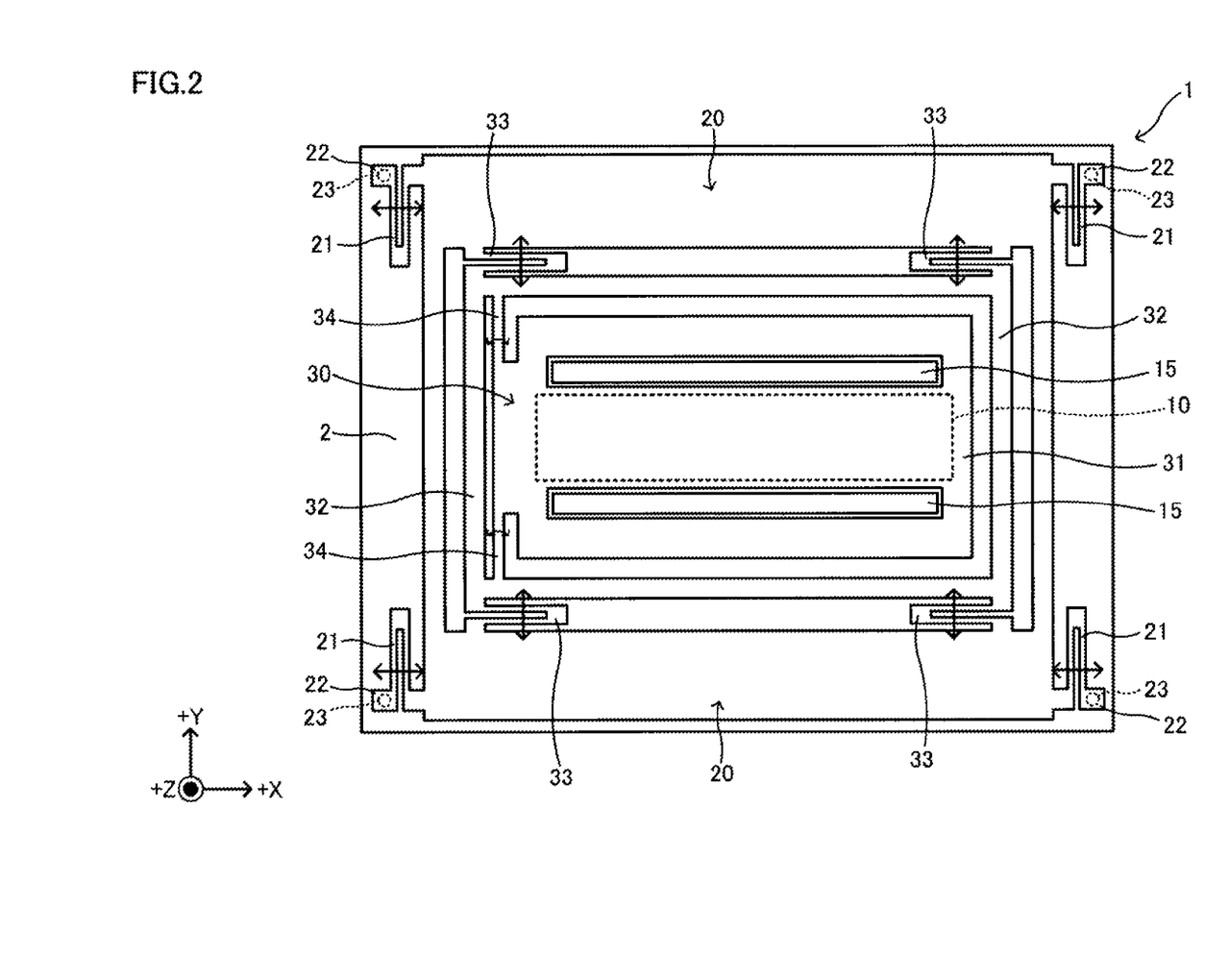
FIG. 2 is a plan view showing a schematic configuration of a MEMS structure according to a second embodiment.

Next, the following fully describes an embodiment (second embodiment) different from the first embodiment with reference to FIG. 2. It should be noted that a MEMS structure 1 according to the second embodiment has substantially the same basic configuration as that of MEMS structure 1 according to the first embodiment, and is different therefrom in terms of the configuration of movable portion 30. The same configurations as those of the first embodiment are not repeatedly described and configurations in relation with the above-described difference will be described in detail.

As with the first embodiment, MEMS structure 1 according to the second embodiment is configured such that main body portion 20 and movable portion 30 are positioned, by anchors 22 or the like formed on substrate 2, above the Z direction detection electrode 10 which is fixedly provided on the surface of substrate 2 (see FIG. 2). As with the first embodiment, the Z direction detection electrode 10 and the Y direction detection electrode 15 are preferably formed on the surface of substrate 2.

Also in the second embodiment, main body portion 20 and plate-like movable portion 30 are positioned at the center portion of substrate 2, and main body portion 20 and movable portion 30 are positioned in parallel with each other with a predetermined space from the surface of substrate 2 by anchors 22 or the like provided at the four corners of substrate 2. Main body portion 20 preferably has a movable electrode (not shown) for oscillation, and is formed to attain oscillation in the X direction by cooperating with a fixed electrode for oscillation (not shown) provided on the surface of substrate 2.

Also in MEMS structure 1 according to the second embodiment, movable portion 30 includes a movable weight 31, an intermediate frame portion 32, elastic supporting portions 33, and torsion bars 34, and is provided to be displaceable relative to main body portion 20 (see FIG. 2).

Movable weight 31 preferably takes the form of a substantially rectangular plate when viewed in a plan view and is positioned such that long sides of movable weight 31 extend along the X direction. Movable weight 31 is connected to the intermediate frame portion 32 by a pair of torsion bars 34 located at its left hand side as viewed in FIG. 2, and is located above and facing the Z direction detection electrode 10 located on the surface of substrate 2. Movable weight 31 is supported to be pivotable the Y axis (the axes of torsion bars 34), whereby the right hand side of movable weight 31 can be displaced in the Z direction. Accordingly, MEMS structure 1 can change a capacitance between movable portion 30 and Z direction detection electrode 10 by changing a distance or the like from Z direction detection electrode 10.

Intermediate frame portion 32 is preferably formed in the form of a rectangular frame when viewed in a plan view, and is positioned to surround the outer edges of movable weight 31 which is also preferably formed in the form of a substantially rectangular plate. As shown in FIG. 2, an inner wall of intermediate frame portion 32 is spaced from the outer edge of movable weight 31. At one end side of intermediate frame portion 32 in the long side direction (namely, an end portion in the -X direction). A pair of torsion bars 34 located on the left hand side of the movable weight (as viewed in FIG. 2) are formed at the four corners (of the intermediate frame portion to connect movable weight 31 to intermediate frame portion 32. Elastic supporting portions 33 are formed to connect main body portion 20 to respective corner portions in intermediate frame portion 32.

Each elastic supporting portion 33 has one end connected to a corner portion of intermediate frame portion 32 and the other end connected to the inner side surface in main body portion 20. As a result, elastic supporting portions 33 supports intermediate frame portion 32 at its end portions thereby supporting the four corner portions of intermediate frame portion 32. Each elastic supporting portion 33 is configured to expand and contract in the Y direction so as to allow intermediate frame portion 32 (and with it moveable weight 31) to be displaced relative to main body portion 20 in the Y direction. Moreover, elastic supporting portion 33 is preferably formed to exhibit a predetermined rigidity in the X and Z directions. Therefore, intermediate frame portion 32 is regulated by each elastic supporting portion 33 from being displaced (in any significant amount) relative to main body portion 20 in the and Z directions.

Each of torsion bars 34 is preferably formed at the left hand side of movable weight 31 and is preferably in the form of a bar extending in the Y direction. Each torsion bar 34 has one end connected to the inner side surface of intermediate frame portion 32 and the other end portion connected to the left hand side of movable weight 31. Therefore, each torsion bar 34 supports the left hand side of movable weight 31 to be pivotable along the axis (the Y axis) of the torsion bars 34 in response to the application of external forces. Moreover, since torsion bar 34 is formed at the one end portion of movable weight 31, a large torque resulting from external forces applied to the movable weight 31 can be obtained. In accordance with MEMS structure 1, this can contribute to improvement in sensitivity of the sensor.

(Displacement of Movable Portion 30 in Y Direction)

The following describes an operation of each portion in MEMS structure 1 according to the second embodiment configured as described above when movable portion 30 is displaced in the Y direction. When an external force acts on MEMS structure 1 to displace movable portion 30 in the Y direction, intermediate frame portion 32 elastically deforms and displaces each elastic supporting portion 33 in the Y direction. The movable weight 31 is supported on intermediate frame portion 32 by torsion bars 34, and is therefore prevented from being displaced in the Y direction relative to the intermediate frame portion 32. Accordingly, movable weight 31 is displaced in the Y direction together with intermediate frame portion 32. In other words, in accordance with MEMS structure 1 according to the second embodiment, movable portions 30 (movable weight 31 and intermediate frame portion 32) is displaced in the Y direction by an external force while deforming each elastic supporting portion 33, so that the displacement of movable portion 30 in the Y direction can be detected in accordance with a change in capacitance between movable portion 30 and Y direction detection electrode 15.

Thus, in MEMS structure 1 according to the second embodiment, each elastic supporting portion 33 connecting main body portion 20 to intermediate frame portion 32, rather than torsion bar 34 connecting movable weight 31 to intermediate frame portion 32, acts to displace movable portion 30 in the Y direction. Hence, in accordance with MEMS structure 1 according to the second embodiment, in order to adjust/select the resonant frequency in relation with the Y direction, the spring constant of each elastic supporting portion 33 involved in the displacement of movable portion 30 in the Y direction can be adjusted/selected, thereby adjusting the resonant frequency in relation with the Y direction to a desired value.

Furthermore, in the second embodiment, each elastic supporting portion 33 connects main body portion 20 to intermediate frame portion 32, and torsion bar 34 connects movable weight 31 to intermediate frame portion 32. Therefore, the spring constant of torsion bar 34 is not affected by adjusting/selecting the spring constant of each elastic supporting portion 33. Therefore, in accordance with MEMS structure 1, the spring constant of torsion bar 34 does not need to be taken into consideration when adjusting the resonant frequency in relation with the Y direction, whereby the resonant frequency in relation with the Y direction can be readily adjusted to a desired value.

(Displacement of Movable Weight 31 in the Z Direction)

Next, the following describes an operation of each portion in MEMS structure 1 according to the second embodiment when movable weight 31 is displaced in the Z direction. When an external cause acts on MEMS structure 1 to displace movable weight 31 in the Z direction, intermediate frame portion 32 is supported by each elastic supporting portion 33 and is prevented from being displaced relative to main body portion 20 in any significant amount. On the other hand, movable weight 31, which is supported to be shakable relative to intermediate frame portion 32 by torsion bars 34 formed at the left hand side thereof, is configured to be displaceable in the Z direction in response to external forces applied to the movable weight 31. In other words, in accordance with MEMS structure 1 according to the second embodiment, movable weight 31 constituting a large part (preferably over 50%) of movable portion 30 is displaced in the Z direction by an external force while twisting and deforming each torsion bar 34, so that the displacement of movable weight 31 in the Z direction can be detected in accordance with an amount of change in capacitance between movable weight 31 and Z direction detection electrode 10.

Thus, in MEMS structure 1 according to the second embodiment, each torsion bar 34 connecting movable weight 31 to intermediate frame portion 32, rather than each elastic supporting portion 33 connecting main body portion 20 to intermediate frame portion 32, acts to displace movable portion 30 in the Z direction. Hence, in accordance with MEMS structure 1, in order to adjust the resonant frequency in relation with the Z direction, the spring constant of torsion bar 34 involved in the displacement of movable portion 30 in the Z direction can be adjusted, thereby adjusting the resonant frequency in relation with the Z direction to a desired value.

As described above, each elastic supporting portion 33 connects main body portion 20 to intermediate frame portion 32, and torsion bar 34 connects movable weight 31 to intermediate frame portion 32. Therefore, the spring constant of each elastic supporting portion 33 is not affected by adjusting the spring constant of torsion bar 34. Therefore, in accordance with MEMS structure 1, the spring constant of each elastic supporting portion 33 does not need to be taken into consideration when adjusting the resonant frequency in relation with the Y direction, whereby the resonant frequency in relation with the Z direction can be readily adjusted to a desired value.

As described above, in MEMS structure 1 according to the second embodiment, intermediate frame portion 32 is connected to main body portion 20 by elastic supporting portions 33 which are elastically deformable in the Y direction, so that movable portion 30 is configured to be displaceable in the Y direction. Moreover, since movable weight 31 is supported by torsion bars 34 to pivot relative to intermediate frame portion 32, movable weight 31 is configured to be displaceable in the Z direction. Thus, in accordance with MEMS structure 1, movable weight 31 can be displaced in the two directions, i.e., the Y and Z directions.

Moreover, in accordance with MEMS structure 1, since intermediate frame portion 32 is disposed between each elastic supporting portion 33 and torsion bar 34, the adjustment/selection of each elastic supporting portion 33 for the resonant frequency or the like does not affect the resonant frequency or the like of torsion bar 34, and the adjustment/selection of torsion bar 34 for the resonant frequency or the like does not affect the resonant frequency or the like of each elastic supporting portion 33. That is, in accordance with MEMS structure 1, the resonant frequencies or the like in relation with the Y and Z directions can be adjusted without affecting each other, thus allowing them to be readily adjusted to desired values. Accordingly, the sensitivity of the sensor can also be readily adjusted to a desired value.

In MEMS structure 1, each elastic supporting portion 33, which connects main body portion 20 to intermediate frame portion 32 at corner portions (i.e., the both ends in the X direction) of intermediate frame portion 32 formed in the form of a rectangular frame when viewed in a plan view, regulates intermediate frame portion 32 from being displaced relative to main body portion 20 in the X and Z directions. Thus, in accordance with MEMS structure 1, each elastic supporting portion 33 permits displacement of intermediate frame portion 32 relative to main body portion 20 in the Y direction, and more securely suppresses displacement of intermediate frame portion 32 relative to main body portion 20 in the X direction and the Z direction.

Heretofore, the present invention has been described based on the embodiments; however, the present invention should not be limited to the above-described embodiments at all, and can be modified and changed in various manners without deviating from the gist of the present invention. For example, a physical quantity detected by a sensor having the MEMS structure used therein should not be limited to the angular velocity described above, and a direction (Z direction or the like) in which the physical quantity can be detected can be also changed appropriately. Moreover, the shape, configuration, and the like of each portion included in MEMS structure 1 are just exemplary and may be changed appropriately.

It should be noted that in each of the embodiments described above, MEMS structure 1 is an exemplary MEMS structure of the present invention. Substrate 2 is an exemplary substrate. Main body portion 20 is an exemplary supporting portion. Each of Z direction detection electrode 10 and Y direction detection electrode 15 is an exemplary fixed electrode. Movable portion 30 is an exemplary movable portion. Movable weight 31 is an exemplary weight portion. Intermediate frame portion 32 is an exemplary frame-shaped portion. Elastic supporting portion 33 is an exemplary elastic supporting portion. Torsion bar 34 is an exemplary torsion bar. The X direction and the Y direction are exemplary plane directions parallel to a plane of the substrate. The Z direction is an exemplary direction perpendicular to the plane of the substrate.

It should be noted that the embodiments disclosed herein are just illustrative and are not restrictive in any points. The scope of the present invention is defined by the terms of the claims, rather than the embodiments described above, and is intended to include any modifications within the scope and meaning equivalent to the terms of the claims.

REFERENCE SIGNS LIST

1: MEMS structure; 2: substrate; 10: Z direction detection electrode; 15: Y direction detection electrode; 20: main body portion; 21: driving spring; 22: anchor; 23: through hole; 30: movable portion; 31: movable weight; 32: intermediate frame portion; 33: elastic supporting portion; 34: torsion bar.

The invention claimed is:

1. A MEMS structure comprising:
a planar substrate;
a support body coupled to the planar substrate;
a fixed electrode coupled to the planar substrate; and
a movable portion spaced from and facing the fixed electrode, the movable portion being coupled to the substrate and including:
a movable weight;
an intermediate frame surrounding an outer edge of the movable weight;
a plurality of elastic supports connecting the movable weight to intermediate frame, the elastic supports being elastically deformable in a first direction extending parallel to the plane of the planar substrate such that the movable weight can move in the first direction; and
at least one torsion bar pivotally connecting one end of the intermediate frame to the support body so as to allow the intermediate frame, and with it the movable weight, to pivot around an axis which extends parallel to the plane of the planar substrate and perpendicular to the first direction.

2. The MEMS structure according to claim 1, wherein:
the movable weight has a rectangular shape including first and second opposite edges extending along the first direction and third and fourth opposite edges extending along the second direction; and
at least one of the elastic supports is connected between the first edge and the intermediate frame and at least one of the elastic supports is connected between the second edge and the intermediate frame.

3. The MEMS structure according to claim 2, wherein the movable weight has four corners and the elastic supports connect the four corners of the movable weight to the intermediate frame.

4. The MEMS structure according to claim 1, wherein the support body and the movable portion are planar in shape and lie in the same plane.

5. A MEMS structure comprising:
a planar substrate;
a support body coupled to the planar substrate;
a fixed electrode coupled to the planar substrate; and
a movable portion spaced from and facing the fixed electrode, the movable portion being coupled to the planar substrate and including:
  a movable weight;
  an intermediate frame surrounding an outer edge of the movable weight;
  at least one torsion bar pivotally connecting one end of the movable weight to the intermediate frame so as to allow the movable weight to pivot around an axis which extends parallel to the plane of the planar substrate and in a first direction; and
  a plurality of elastic supports connecting the intermediate frame to the support body, the elastic supports being elastically deformable in a second direction extending horizontal to the plane of the planar substrate and perpendicular to the first direction such that the intermediate frame, and with it the movable weight, can move in the second direction.

6. The MEMS structure according to claim 5, wherein:
the movable weight has a rectangular shape including first and second opposite edges extending along the first direction and third and fourth opposite edges extending along the second direction; and
the at least one torsion bar is connected between the first edge and the intermediate frame.

7. The MEMS structure according to claim 6, wherein the intermediate frame has four corners and the elastic supports connect the four corners of the intermediate frame to the support body.

8. The MEMS structure according to claim 5, wherein the support body and the movable portion are planar in shape and lie in the same plane.

* * * * *